(12) United States Patent
Umemura

(10) Patent No.: US 10,196,020 B2
(45) Date of Patent: Feb. 5, 2019

(54) DEVICE CASE CLOSING STRUCTURE

(71) Applicant: Sumitomo Wiring Systems, Ltd., Yokkaichi, Mie (JP)

(72) Inventor: Kenji Umemura, Mie (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 15/772,254

(22) PCT Filed: Oct. 17, 2016

(86) PCT No.: PCT/JP2016/080645
§ 371 (c)(1),
(2) Date: Apr. 30, 2018

(87) PCT Pub. No.: WO2017/077842
PCT Pub. Date: May 11, 2017

(65) Prior Publication Data
US 2018/0312123 A1    Nov. 1, 2018

(30) Foreign Application Priority Data
Nov. 2, 2015 (JP) ................... 2015-215678

(51) Int. Cl.
*H01R 12/00* (2006.01)
*B60R 16/023* (2006.01)
(Continued)

(52) U.S. Cl.
CPC ...... *B60R 16/0239* (2013.01); *B60R 16/0215* (2013.01); *H05K 5/065* (2013.01)

(58) Field of Classification Search
CPC ............ B60R 16/0239; B60R 16/0215; H05K 5/065; H01R 13/5202; H01R 13/447
(Continued)

(56) References Cited

U.S. PATENT DOCUMENTS 5,758,931 A * 6/1998 Hio ..................... B60R 16/0238
303/113.1
10,050,374 B1 * 8/2018 Lee .................... H01R 13/5202
(Continued)

FOREIGN PATENT DOCUMENTS

| JP | 2001-168545 | 6/2001 |
| JP | 2008-282981 | 11/2008 |

(Continued)

OTHER PUBLICATIONS

International Search Report dated Jan. 10, 2017.

*Primary Examiner* — Jean F Duverne
(74) *Attorney, Agent, or Firm* — Gerald E. Hespos; Michael J. Porco; Matthew T. Hespos

(57) ABSTRACT

A device case closing structure (1) has a shield connector (20) with a work opening (25) and is assembled with a device case (10) while holding terminal fittings (32). A seal cover (40) is assembled with the shield connector (20) for closing the work opening (25). Stud bolts (14) connect the terminal fittings (32) with terminal blocks (13) in the device case (10). The seal cover (40) includes a cover body (41) to be fit to the shield connector (20). The cover body (41) includes a vent hole (55) and a breathable film (57) having waterproofness and breathability is arranged to close the vent hole (55). A part of the vent hole (55) serves as a bolt receiving portion (51) for receiving a tip of the stud bolt (14) inside.

2 Claims, 6 Drawing Sheets

(51) Int. Cl.
*B60R 16/02* (2006.01)
*H05K 5/06* (2006.01)

(58) Field of Classification Search
USPC ......................................... 439/76.2
See application file for complete search history.

(56) References Cited

U.S. PATENT DOCUMENTS

| | | | | |
|---|---|---|---|---|
| 2009/0109635 | A1* | 4/2009 | Chen | G06F 1/1626 |
| | | | | 361/728 |
| 2012/0118773 | A1* | 5/2012 | Rayner | G06F 1/1626 |
| | | | | 206/320 |
| 2012/0285097 | A1 | 11/2012 | Sakakura | |
| 2013/0044420 | A1* | 2/2013 | Iwamoto | H01R 13/447 |
| | | | | 361/679.01 |
| 2014/0113467 | A1* | 4/2014 | Senatori | G06F 1/1633 |
| | | | | 439/142 |

FOREIGN PATENT DOCUMENTS

| | | |
|---|---|---|
| JP | 2012-236450 | 12/2012 |
| JP | 2014-087245 | 5/2014 |
| JP | 2014-164825 | 9/2014 |

* cited by examiner

DEVICE CASE CLOSING STRUCTURE

BACKGROUND

Field of the Invention

This specification relates to a device case closing structure.

Description of the Related Art

Japanese Unexamined Patent Publication No. 2001-168545 discloses an electrical device to be installed in an automotive vehicle or the like. The electrical device is accommodated in a case that is provided with a connector, a terminal block for connection of the electrical device and an external device. The electrical device generally is required to be waterproof, and thus the case is of a sealed type. The sealed case has a mounting hole and a filter allowing the passage of air, but not allowing the passage of water is mounted in the mounting hole. The filter alleviates a pressure difference between the inside and outside of the case generated by an ambient temperature variation or the like while maintaining waterproofness.

However, in the above configuration, a structure is complicated by providing the filter.

SUMMARY

A device case closing structure disclosed by this specification includes a device case having a device terminal portion arranged inside. The device case closing structure further has a connector including an opening. The connector is assembled with the device case while holding a connection terminal. A seal cover is provided for closing the opening by being assembled with the connector, and a bolt is provided for connecting the device terminal portion and the connection terminal. The seal cover includes a cover body to be fit to the connector. The cover body includes a vent hole penetrating from a surface facing inwardly of the device case to a surface facing outwardly of the device case with the cover body fit to the connector. A ventilation member that has waterproofness and breathability is arranged to close the vent hole. The vent hole functions as a bolt receiving portion for receiving a tip part of the bolt inside.

According to this configuration, the seal cover doubles as a filter for ventilation and the vent hole doubles as the bolt receiving portion for receiving the tip part of the bolt for connecting the device terminal portion and the connection terminal. Thus, the device case closing structure can be simplified.

The ventilation member may be arranged to close the vent hole from the surface facing out of the device case on the cover body, and the cover body may include a surrounding wall projecting from the surface facing outwardly of the device case and arranged to surround the ventilation member. According to this configuration, the ventilation member is surrounded by the surrounding wall. Thus, a worker's fingers cannot touch the ventilation member to stain the ventilation member and to reduce ventilation performance.

According to this specification, it is possible to simplify a device case closing structure.

DETAILED DESCRIPTION

Figure 1:
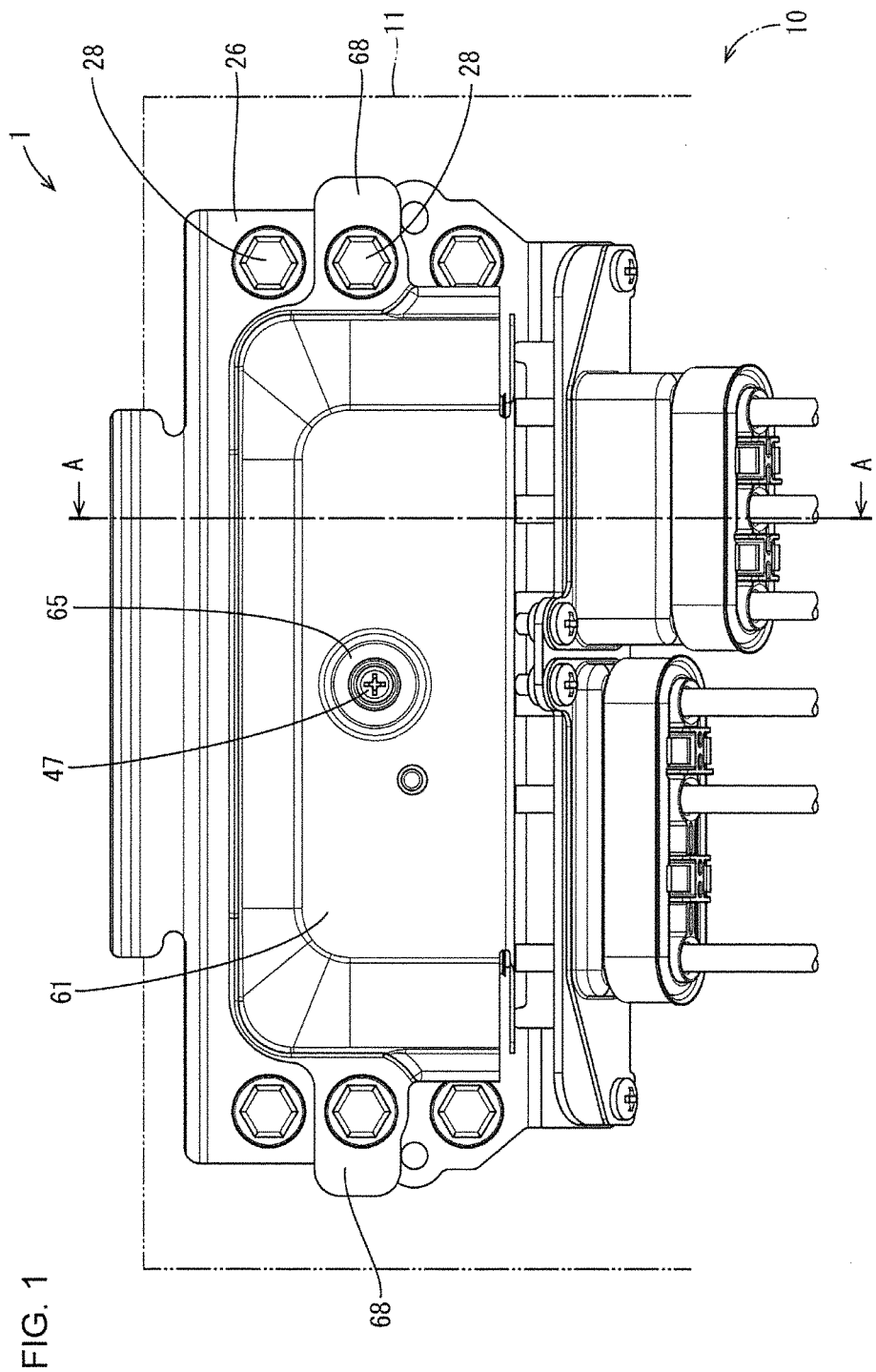
FIG. 1 is a plan view showing a state where a shield connector and a seal cover are assembled with a device case in an embodiment.

An embodiment is described with reference to FIGS. 1 to 6. A device case closing structure 1 of this embodiment includes, as shown in FIG. 2, a device case 10 having terminal blocks 13 (equivalent to a device terminal portion) arranged inside, a shield connector 20 having a work opening 25 and to be assembled with the device case 10 while holding terminal fittings 32, a seal cover 40 for closing the work opening 25 by being assembled with the shield connector 20, and stud bolts 14 for connecting the terminal blocks 13 and the terminal fittings 32.

[Device Case 10]

The device case 10 is installed in a vehicle to accommodate a device, such as a motor or an inverter. This device case 10 is a metal box having an electromagnetic shielding function and includes a case wall 11 separating between an internal space and an external space. The case wall 11 includes a connector mounting hole 12 penetrating from an inwardly facing surface to an outwardly facing surface of the device case 10, and the shield connector 20 is assembled with this case wall 11 while being aligned with the connector mounting hole 12. Terminal blocks 13 including device terminals connected to the device are arranged inside the device case 10. The stud bolt 14 projects from each terminal block 13.

[Shield Connector 20]

As shown in FIG. 2, the shield connector 20 includes a housing 21 for holding wires with terminals 30, and a fixing plate 26.

Each of the wires with terminals 30 has a general configuration that a terminal fitting 32 is connected to an end of a wire 31 as shown in FIG. 2. The terminal fitting 32 includes a crimping portion 33 to be crimped to the end of the wire 31 and a connecting portion 34 continuous from this crimping portion 33.

The housing 21 is made of synthetic resin and includes, as shown in FIG. 2, a receptacle 22 and wire holding portions 23. The receptacle 22 is a tubular part having openings on both ends. Each of the wire holding portions 23 is a hollow cylindrical part extending out from the outer peripheral surface of the receptacle 22. An end part of the wire 31 and the crimping portion 33 are arranged inside each wire holding portion 23. The connecting portion 34 of each terminal fitting 32 penetrates through a tubular wall of the receptacle 22 to project into the receptacle 22.

Figure 2:
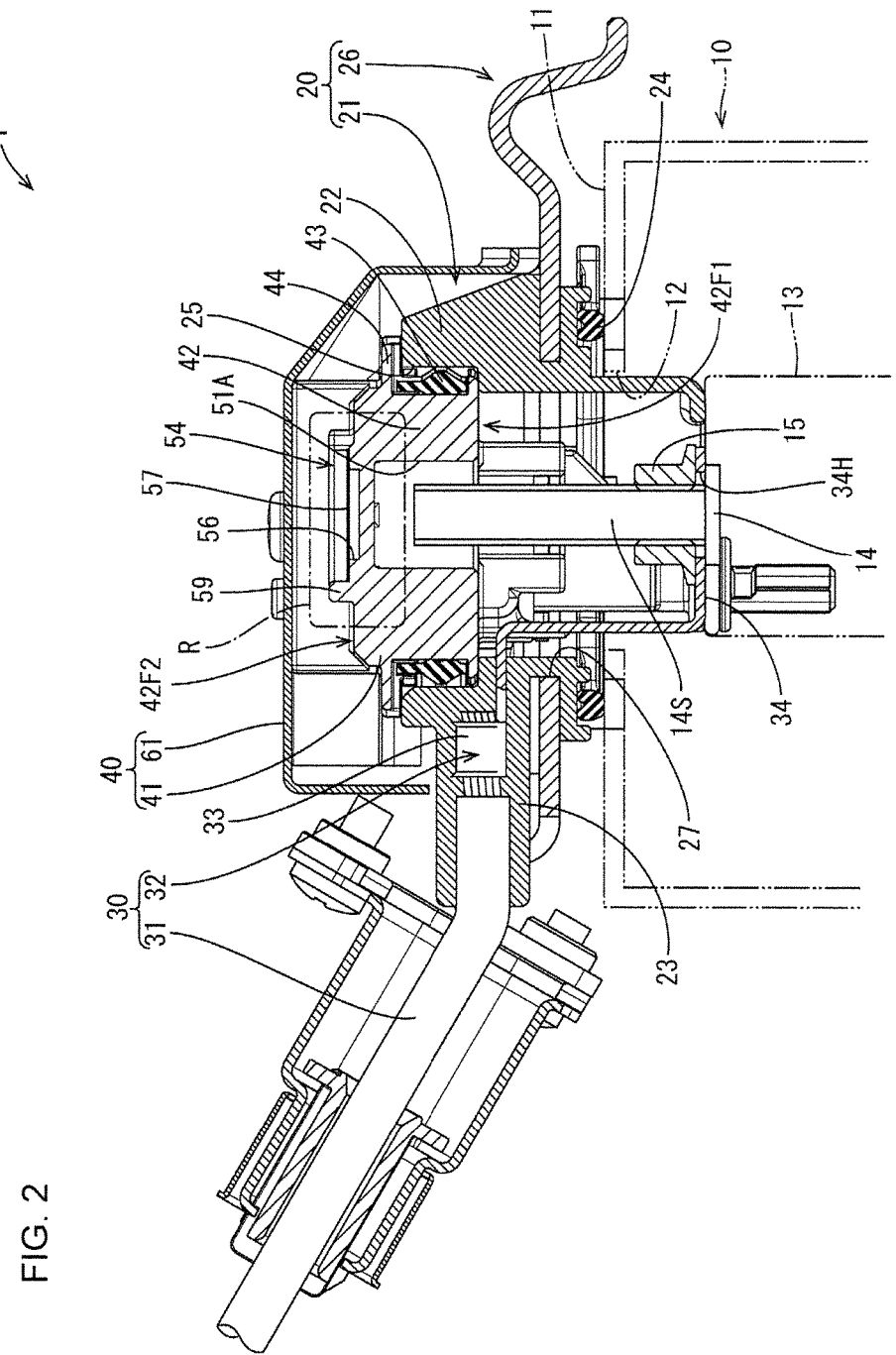
FIG. 2 is a section along A-A of FIG. 1.

The fixing plate 26 is a long, narrow substantially rectangular plate made of metal, as shown in FIG. 1, and includes a housing mounting hole 27 penetrating from one plate surface to the other plate surface, as shown in FIG. 2. A part of the fixing plate 26 around the housing mounting hole 27 is embedded in the receptacle 22, and the fixing plate 26 is fixed to the housing 21 in a state where an outer peripheral edge part excluding this embedded part projects out from the outer peripheral surface of the receptacle 22.

The shield connector 20 is arranged such that one opening, out of the openings on the both ends of the receptacle 22, faces toward the connector mounting hole 12, as shown in FIG. 2, and is assembled with the device case 10 by fixing the fixing plate 26 to the case wall 11 using mounting bolts 28, as shown in FIG. 1. As shown in FIG. 2, a first sealing member 24 is disposed between the receptacle 22 and the case wall 11. This first sealing member 24 is sandwiched between the receptacle 22 and the case wall 11 to seal a clearance between the receptacle 22 and the case wall 11. The other opening (upper opening in FIG. 2) of the receptacle 22 serves as the work opening 25 used by a worker to perform an operation.

With the shield connector 20 assembled with the device case 10, shafts 14S of the stud bolts 14 are located in the receptacle 22, as shown in FIG. 2. The connecting portion 34 of each terminal fitting 32 includes an insertion hole 34H through which the shaft 14S of the stud bolt 14 is inserted. Each connecting portion 34 is fixed to each terminal block 13 by screwing a nut 15 onto the shaft 14S after the shaft 14S is inserted through the insertion hole 34H. At the time of a connecting operation of the terminal block 13 and the connecting portion 34, the worker inserts his hand through the work opening 25 to perform the operation. When the connecting operation is not performed, this work opening 25 is closed by the seal cover 40.

[Seal Cover 40]

Figure 4:
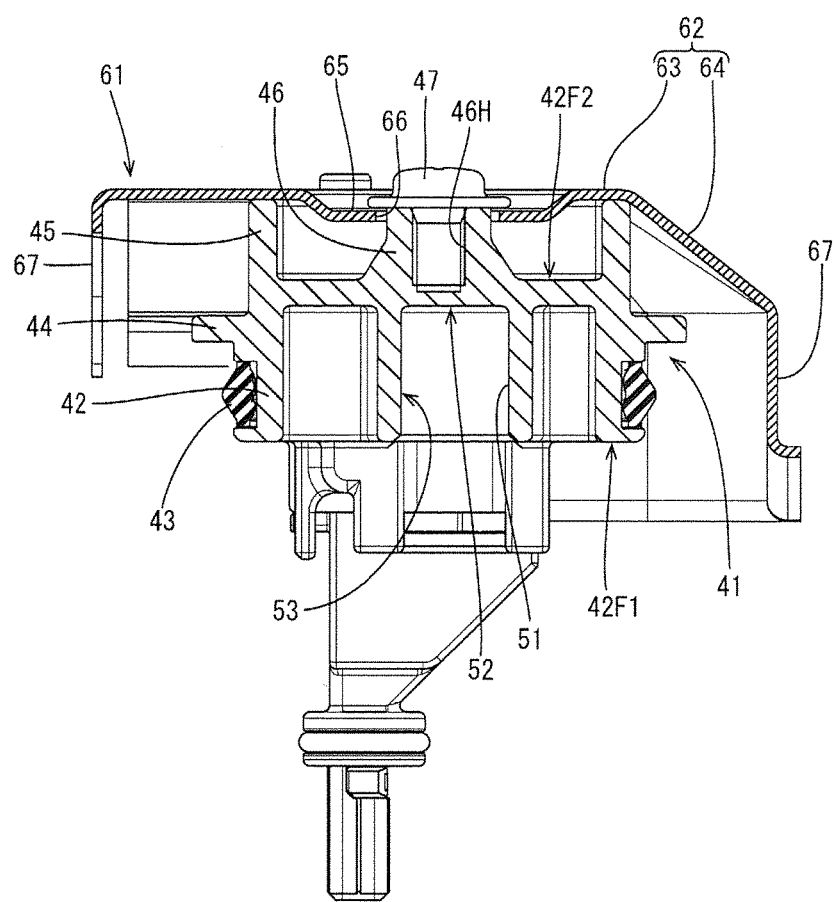
FIG. 4 is a section along B-B of FIG. 3.

As shown in FIGS. 2 and 4, the seal cover 40 includes a cover body 41 for closing the work opening 25 by being fit to the housing 21 and a shield shell 61 made of metal and to be assembled with this cover body 41.

The cover body 41 is made of synthetic resin and includes, as shown in FIGS. 2 and 4, a fitting 42, a flange 44, a peripheral wall 45, a boss 46, a ventilation portion 54 and a surrounding wall 59.

As shown in FIG. 2, the fitting 42 is a block-like part to be fit into the receptacle 22. A second sealing member 43 is disposed on the outer peripheral surface of the fitting 42. A clearance between the outer peripheral surface of the fitting 42 and the inner peripheral surface of the receptacle 22 is sealed by this second sealing member 43.

The fitting 42 has a surface facing inwardly of the device case 10 (fitting surface 42F1) and a surface facing outwardly of the device case 10 (shell fixing surface 42F2) in a state fit in the receptacle 22. As shown in FIG. 2, the fitting surface 42F1 faces the terminal blocks 13 when the seal cover 40 is assembled with the device case 10 and bolt receiving portions 51 for receiving tips of the shafts 14S of the stud bolts 14 are arranged in this fitting surface 42F1. As shown in FIG. 4, each bolt receiving portion 51 is a recess recessed from the fitting surface 42F1 as a reference and is defined by a circular back end surface 52 parallel to the fitting surface 42F1 and an inner peripheral surface 53 extending from a peripheral edge of this back end surface 52 to the fitting surface 42F1.

The flange 44 projects out from the outer peripheral surface of the fitting 42. With the seal cover 40 assembled with the housing 21, the flange 44 is in contact with a hole edge of the work opening 25, as shown in FIG. 2, so that the cover body 41 is positioned with respect to the seal cover 40.

As shown in FIG. 4, the peripheral wall 45 extends perpendicular to the shell fixing surface 42F2 from a peripheral edge of the shell fixing surface 42F2 in the fitting 42.

As shown in FIG. 4, the boss 46 is a cylindrical part arranged in a center of the shell fixing surface 42F2 and extending perpendicular to the shell fixing surface 42F2. A lower hole 46H for receiving a tap screw 47 for fixing the shield shell 61 to the cover body 41 is provided in a projecting end surface of the boss 46. A height of the boss 46 from the shell fixing surface 42F2 to the projecting end surface of the boss is larger than a height of the peripheral wall 45 from the shell fixing surface 42F2 to a projecting end surface of the peripheral wall 45.

Figure 5:
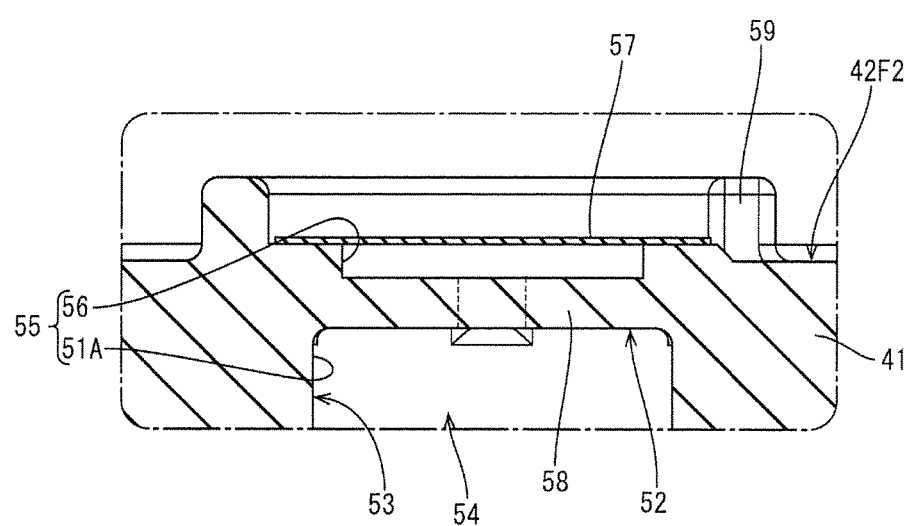
FIG. 5 is an enlarged view of the inside of a circle R of FIG. 2.

As shown in FIGS. 2 and 5, the ventilation portion 54 is composed of a vent hole 55, a breathable film 57 (equivalent to a ventilation member), a film protecting portion 58 and the surrounding wall 59.

As shown in FIGS. 2 and 5, the vent hole 55 is composed of one 51A of the plurality of bolt receiving portions 51 and a communication hole 56 communicating with this bolt receiving portion 51. The communication hole 56 is a through hole penetrating from the back end surface 52 of the one bolt receiving portion 51A to the shell fixing surface 42F2, has an inner diameter slightly smaller than an inner diameter of the one bolt receiving portion 51A and is arranged concentrically with the one bolt receiving portion 51A. The vent hole 55 allows communication between the internal and external spaces of the device cover 10 with the seal cover 40 mounted on the shield connector 20.

The breathable film 57 is a two-layer film composed of a nonwoven fabric layer and a PTFE (polytetrafluoroethylene) layer overlapping on the nonwoven fabric layer and has waterproofness and breathability. This breathable film 57 has an outer shape somewhat larger than a hole edge of the communication hole 56 and is arranged in the shell fixing surface 42F2 to close the communication hole 56 by bonding a peripheral edge part to the shell fixing surface 42F2, for example, using a heat welding technique. The breathable film 57 ensures that moisture cannot enter and exit from the device cover 10, but air can enter and exit from the device cover 10.

Figure 6:
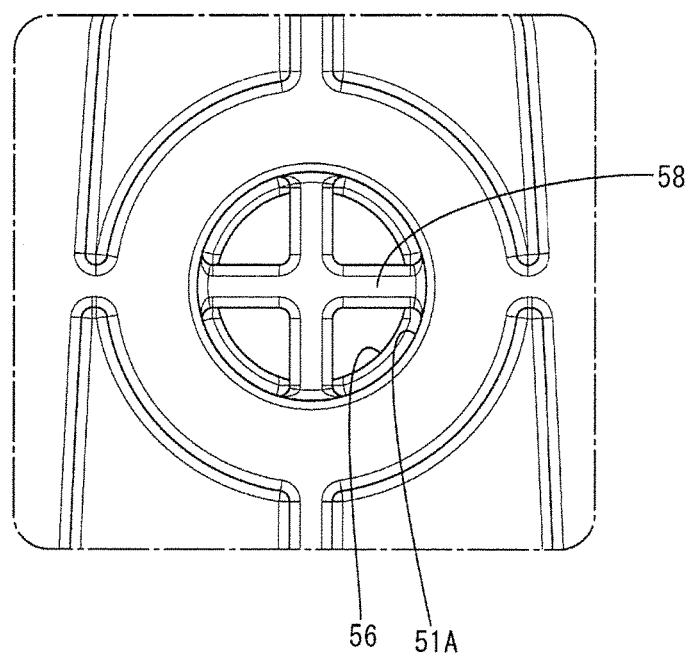
FIG. 6 is an enlarged view of a part around a vent hole on a cover body.

The film protecting portion 58 is a cross-shaped part having two intersecting bars, as shown in FIG. 6, and is arranged to partition between the communication hole 56 and the one bolt receiving portion 51A on a boundary between the communication hole 56 and the one bolt receiving portion 51A, as shown in FIG. 5. Spaces are present between the film protecting portion 58 and the inner peripheral surface of the vent hole 55, as shown in FIG. 6, and air can pass through these spaces. The film protecting portion 58 ensures that the worker's fingers cannot touch the breathable film 57 from the side of the bolt receiving portion 51 to stain the breathable film 57 at the time of an assembling operation of the seal cover 40 or the like.

As shown in FIGS. 2 and 5, the surrounding wall 59 is an annular wall rising from the shell fixing surface 42F2 and surrounds the communication hole 56 and the breathable film 57. The surrounding wall 59 prevents the worker's fingers from touching the breathable film 57 from the side of the shell fixing surface 42F2 to stain the breathable film 57, for example, at the time of an assembling operation of the shield shell 61 and the cover body 41.

The shield shell 61 is a tray-like member formed by press-working a metal plate material and, as shown in FIGS. 2 and 4, is sufficiently larger than the cover body 41 to cover substantially the entire cover body 41 excluding the fitting surface 42F1. This shield shell 61 includes a main plate 62, a side plate 67 continuous from this main plate 62 and two mounting plates 68 continuous from the side plate 67.

Figure 3:
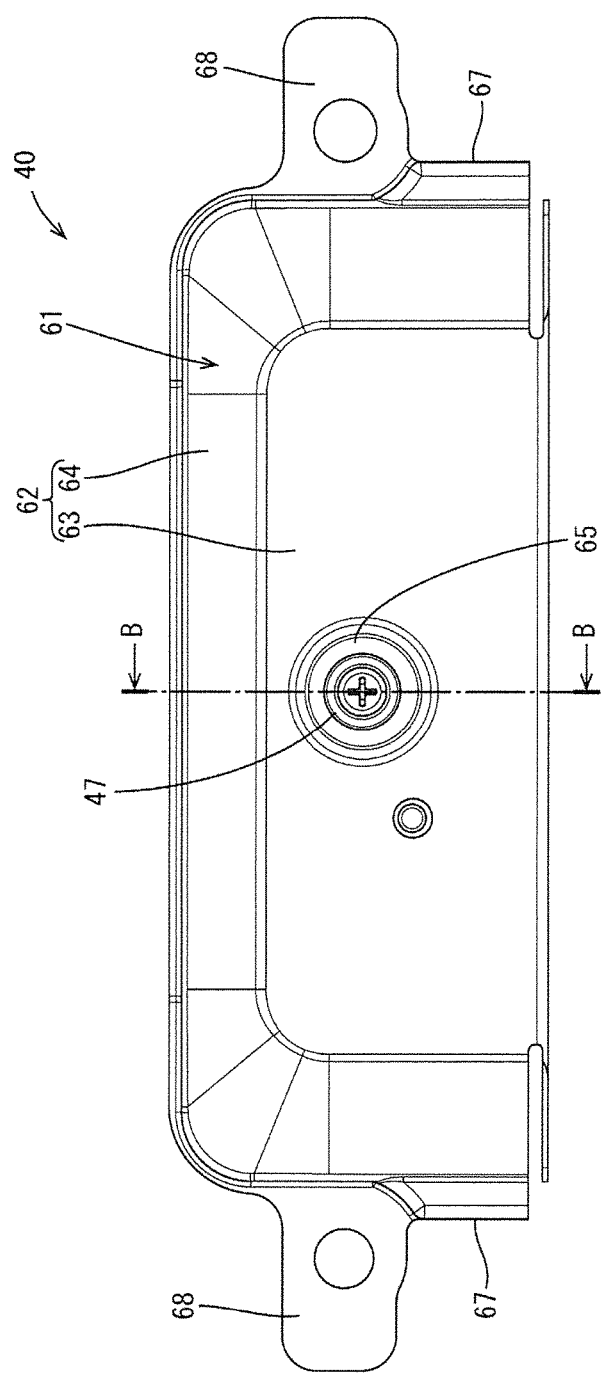
FIG. 3 is a plan view of the seal cover of the embodiment.

As shown in FIGS. 3 and 4, the main plate 62 is a substantially rectangular plate and includes a flat plate portion 63 and an inclined plate portion 64. The flat plate portion 63 is a rectangular flat plate having an outer shape slightly larger than the work opening 25 of the housing 21. The inclined plate portion 64 is continuous from three sides of the flat plate portion 63, excluding one of a pair of longer sides, and extends slightly obliquely with respect to the flat plate portion 63. The side plate portion 67 is a wall extending perpendicular to the flat plate portion 63 from a peripheral edge of the main plate 62. Each of the mounting plates 68 extends out from the side plate portion 67.

As shown in FIGS. 3 and 4, a circular screw accommodation recess 65 is arranged in a central part of the main plate 62 and is recessed inwardly (toward the side toward which the side plate portion 67 extends) from the flat plate portion 63 as a reference. As shown in FIG. 4, a boss insertion hole 66 is arranged in a central part of the screw accommodation recess 65 and can receive the boss 46.

In assembling the shield shell 61 with the cover body 41, the cover body 41 first is disposed inside the shield shell 61 while a tip of the boss 46 is inserted through the boss insertion hole 66. Then, the tap screw 47 is screwed into the lower hole 46H of the boss 46 to fix the shield shell 61 to the cover body 41. At this time, an internal thread is formed in the lower hole 46H by a screw part of the tap screw 47.

[Assembling of the Sealing Cover 40 with the Shield Connector 20 and the Device Case 10]

In assembling the seal cover 40 with the shield connector 20 and the device cover 10, the seal cover 40 is pressed toward the shield connector 20 and the fitting 42 is pressed into the receptacle 22. After the fitting 42 and the receptacle 22 are fit completely, the mounting plates 68 are fixed to the device cover 10 using the mounting bolts 28. In this way, the work opening 25 is closed With the work opening 25 closed by the seal cover 40, the device cover 10 is in a sealed state. If a pressure difference is generated between the inside and outside of the case due to an ambient temperature variation or the like, air enters and exits through the breathable film 57 so that this pressure difference can be alleviated. Note that since the breathable film 57 is waterproof, water does not enter the device cover 10 through the breathable film 57.

[Functions and Effects]

As described above, the device cover closing structure 1 includes the device cover 10 having the terminal blocks 13 arranged inside, the shield connector 20 including the work opening 25 and to be assembled with the device cover 10 while holding the terminal fittings 32, the seal cover 40 for closing the work opening 25 by being assembled with the shield connector 20, and the stud bolts 14 for connecting the terminal blocks 13 and the terminal fittings 32. The seal cover 40 includes the cover body 41 to be fit to the shield connector 20. The cover body 41 includes the vent hole 55 penetrating from the fitting surface 42F1 facing inwardly of the device cover 10 to the shell fixing surface 42F2 facing outwardly of the device cover 10 with the cover body 41 fit to the shield connector 20, and the breathable film 57 having waterproofness and breathability and arranged to close the vent hole 55. A part of the vent hole 55 serves as the bolt receiving portion 51 for receiving the tip of the stud bolt 14 inside.

According to the above-described configuration, the seal cover 40 for closing the work opening 25 doubles as a filter for ventilation and the vent hole 55 doubles as one (one bolt receiving portion 51A) of the bolt receiving portions 51 for receiving the tips of the stud bolts 14. Thus, the closing structure for the device cover 10 can be simplified.

Further, the breathable film 57 is arranged to close the vent hole 55 from the fitting surface 42F1 of the cover body 41, and the cover body 41 includes the surrounding wall 59 projecting from the fitting surface 42F1 and arranged to surround the breathable film 57. According to this configuration, the breathable film 57 is surrounded by the surrounding wall portion 59 so that the worker's fingers cannot touch the breathable film 57 to stain the breathable film 57 and reduce ventilation performance.

The invention is not limited to the above described and illustrated embodiment. For example, the following modes are also included.

Although the cover body 41 is provided with one ventilation portion 54 in the above embodiment, the cover body 41 may be provided with a plurality of ventilation portions.

Although the breathable film 57 is arranged to close the vent hole 55 from the shell fixing surface 42F2 of the cover body 41 in the above embodiment, the arrangement of a ventilation member is not limited to that of the above embodiment. For example, a ventilation member may be arranged inside the communication hole 56.

LIST OF REFERENCE SIGNS

1 . . . device case closing structure
10 . . . device case
13 . . . terminal block (device terminal portion)
14 . . . stud bolt (bolt)
20 . . . shield connector (connector)
25 . . . work opening (opening)
32 . . . terminal fitting (connection terminal)
40 . . . seal cover
41 . . . cover body
42F1 . . . fitting surface (surface facing inwardly)
42F2 . . . shell fixing surface (surface facing outwardly)
51 . . . bolt receiving portion
55 . . . vent hole
57 . . . breathable film (ventilation member)
59 . . . surrounding wall

The invention claimed is:

1. A device case closing structure, comprising:
a device case having a device terminal portion arranged inside;
a connector including an opening, the connector being assembled with the device case while holding a connection terminal;
a seal cover for closing the opening by being assembled with the connector; and
a bolt for connecting the device terminal portion and the connection terminal;
the seal cover including a cover body to be fit to the connector;
the cover body including a vent hole penetrating from a surface facing inwardly of the device case to a surface facing outwardly of the device case with the cover body fit to the connector and a ventilation member having waterproofness and breathability and arranged to close the vent hole;
the vent hole serving as a bolt receiving portion for receiving a tip part of the bolt inside.

2. The device case closing structure of claim 1, wherein:
the ventilation member is arranged to close the vent hole from the surface facing outwardly of the device case on the cover body; and
the cover body includes a surrounding wall portion projecting from the surface facing outwardly of the device case and arranged to surround the ventilation member.

* * * * *